United States Patent [19]

Yerkes et al.

[11] 4,105,471
[45] Aug. 8, 1978

[54] SOLAR CELL WITH IMPROVED PRINTED CONTACT AND METHOD OF MAKING THE SAME

[75] Inventors: John W. Yerkes, Granada Hills; James E. Avery, Burbank, both of Calif.

[73] Assignee: Arco Solar, Inc., Chatsworth, Calif.

[21] Appl. No.: 804,688

[22] Filed: Jun. 8, 1977

[51] Int. Cl.² ........................................... H01L 31/06
[52] U.S. Cl. .................................. 136/89 CC; 29/572; 29/589; 357/30; 357/65; 357/67; 357/71; 427/75
[58] Field of Search ............. 136/89 CC; 29/572, 589; 357/30, 65, 67, 71; 427/75

[56] References Cited

U.S. PATENT DOCUMENTS

| 3,664,874 | 5/1972 | Epstein | 136/89 |
| 3,943,003 | 3/1976 | Dendall | 136/89 |
| 3,949,463 | 4/1976 | Lindmayer et al. | 29/572 |
| 4,029,518 | 6/1977 | Matsutani et al. | 136/89 |

*Primary Examiner*—Aaron Weisstuch
*Attorney, Agent, or Firm*—Nilsson, Robbins, Dalgarn, Berliner, Carson & Wurst

[57] ABSTRACT

A silicon solar cell having a body of boron doped P-type silicon material with a shallow P/N junction formed therein through diffusion of phosphorous into one surface thereof. A contact pattern of conductive material is formed on the surface of the solar cell in which the P/N junction is formed. The pattern is formed by first depositing a metallic layer upon the entire surface of the body and then applying the contact pattern by printing upon the surface of the metal. The metal has a characteristic such that when heated in the presence of oxygen to an appropriate temperature to fire the conductive material, it oxidizes and forms an anti-reflective layer on the surface of the cell except in those areas where the printed contact pattern is disposed. In the areas of the printed contact pattern the metal forms an ohmic contact between the surface of the silicon and the printed contact pattern and provides a barrier to preclude the conductive contact pattern material from punching through the shallow P/N junction.

7 Claims, 4 Drawing Figures

SOLAR CELL WITH IMPROVED PRINTED CONTACT AND METHOD OF MAKING THE SAME

BACKGROUND OF THE INVENTION

It has been determined that in order to manufacture low cost silicon solar cells large quantities thereof must be made by mass production techniques. To manufacture silicon solar cells in mass production one must utilize a printing technique for applying the conductive material contact pattern on the incident surface of the solar cell to permit efficient collection of the electrical energy as generated. Once the printed contact pattern is applied, the combination of the silicon solar cell with the pattern thereon must be placed into a furnace at an elevated temperature to fire the printed contact material. When the printed contact material is fired it traditionally "punches through" the very thin junction, which usually is on the order of 0.3 microns in thickness, thus shorting the junction and rendering the solar cell inoperative.

To combat this problem, in printed contact solar cells currently being manufactured, the thickness of the junction has been increased somewhat. When this occurs the efficiency of the solar cell is substantially decreased. In addition thereto, even with increased junction thickness, some punch through still occurs and it remains extremely critical to control the temperature to which the cell is raised at the time of firing to form the printed front contact pattern.

As is well known an antireflective coating must be provided on the surface of the solar cell to achieve proper operation. Traditionally, the antireflective coating is applied after the printed contact pattern is produced on the surface of the solar cell. When such occurs the material forming the antireflective coating operates as an insulator on the surface of the front contact pattern of the solar cell. Thus to provide appropriate electrical contact the oxidized insulative layer forming the antireflective coating must be removed from at least a portion of the front contact pattern so that electrical connections can be made to the cell thereby to collect and remove the energy produced in the solar cell.

SUMMARY OF THE INVENTION

An improved solar cell including a P/N junction formed adjacent one surface of a silicon wafer, a layer of metal adhered to said surface, a printed contact layer on said metallic layer, said metallic layer being oxidized except beneath said contact to form an antireflective coating and said metal layer being a silicide at the interface with said wafer beneath said contact pattern.

The method of forming a solar cell including the steps of forming a P/N junction in one surface of a silicon wafer, depositing a metal layer over the surface of said wafer in which said junction is formed, printing a contact material on said metal layer, and heating said wafer in the presence of oxygen to a temperature and for a time sufficient to cause said metal layer to oxidize in all areas except beneath said printed contact and to form a silicide at the interface between said layer and said wafer in the area beneath said contact.

DETAILED DESCRIPTION OF THE PREFERRED EMBODIMENT

Figure 1:
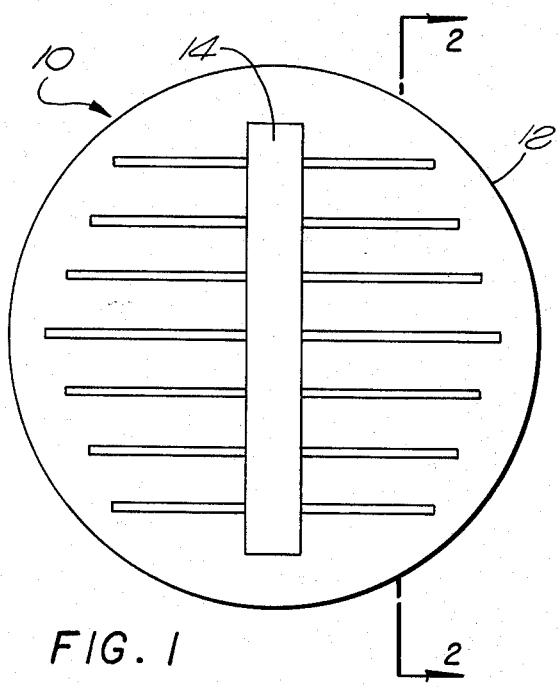
FIG. 1 is a top plan view of a solar cell formed in accordance with the present invention.

As is illustrated in FIG. 1 a solar cell 10 includes a silicon wafer 12 having an appropriate electrically conductive contact pattern 14 formed on the surface thereof in order to collect the desired electrical energy produced as the result of solar energy striking the surface of and being absorbed within the solar cell. As is well known to those skilled in the art the solar cell includes a P/N junction formed in the body thereof by diffusion from an appropriate source of active impurities for an extremely shallow depth.

Figure 2:
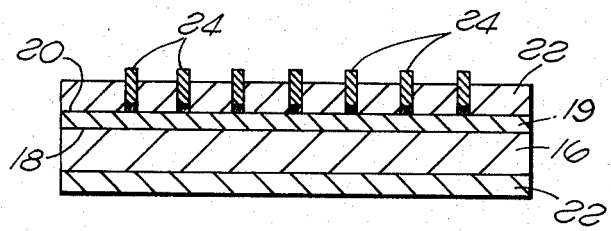
FIG. 2 is a cross sectional view taken about the lines 2—2 of FIG. 1.

As is shown in FIG. 2 the silicon wafer includes a body 16 of silicon material which is preferably P-type and preferably has been doped with boron active impurity in order to provide the desired resistivity for solar cells. The P/N junction 18 has been formed in the surface 20 of the wafer 12 by diffusing phosphorous from a coating of phosphorous pentoxide which has been applied to the body of the wafer. As is well known in the prior art, the phosphorous pentoxide coating is formed by passing phosphorous oxychloride ($POCl_3$) through an open tube while the wafer is heated to an elevated temperature to thereby deposit a phosphorous pentoxide glass on the silicon wafer from which phosphorous then diffuses into the silicon wafer to a depth of approximately 0.3 microns to form the desired silicon P/N junction. Obviously, other dopants and sources thereof may be used as may different starting wafers. This description is provided as exemplary of a preferred embodiment.

Thereafter one surface of the silicon wafer is etched to completely remove the phosphorous pentoxide as well as the junction which has been formed in the body 16 of the P-type silicon semiconductor material. Such etching may be accomplished with the traditional mixture of nitric/hydrofluoric acid or with a gaseous plasma etch.

Thereafter a layer of aluminum paste is applied to the entire surface from which the junction has been removed and the combination is then raised to an elevated temperature on the order of 750° C to cause the aluminum to alloy with the P-type silicon over the entire back portion of the silicon wafer thereby to form a very low resistance back contact 22 for the silicon wafer. The back contact includes a P+ silicon region with a metallic layer of aluminum all formed during the alloying step.

Thereafter the residual phosphorous pentoxide is removed from the front surface of the wafer, thus leaving exposed the surface 20 having the P/N junction 18 formed 0.3 microns therebeneath.

A layer of metal is then applied to a depth of approximately 450 angstroms over the surface 20 of the semiconductor wafer. The purpose of the metal layer is to provide a barrier to preclude punch-through of the printed contact material to be later applied thereby shorting out the junction upon subsequent firing to form the solar cell. It is also desired that the metal layer provide an antireflective coating upon the surface of the solar cell. The metal layer must also function to provide a good ohmic contact between the silicon wafer and the conductive printed contact material. It has been discovered that metals which have the necessary requirements as above-described are tantalum, tungsten and niobium, although there may be others.

Subsequent to the application of the metal layer 20, and for purposes of description, it will be presumed that the metal layer is tantalum, a particular desired conductive contact pattern is then applied to the surface of the metal layer, for example, as illustrated at 14 in FIG. 1. Typically the contact pattern will be printed upon the surface of the tantalum layer. Traditionally the contact material is silver contained within a glass frit along with an appropriate binder, although other contact materials will be well known to those skilled in the art. After the application of the contact pattern to the surface of the tantalum the entire combination is then placed into a furnace and heated to a temperature of approximately 600° C in an oxygen containing atmosphere, for example, air. At this temperature and when exposed to the oxygen within the air the tantalum layer oxidizes forming tantalum pentoxide ($Ta_2O_5$). The tantalum pentoxide functions very effectively as an antireflective coating upon the surface of the semiconductor wafer, and is the stable oxide of tantalum.

However, in those areas where the contact pattern 14 exists upon the surface of the tantalum it appears that the tantalum is shielded from the oxygen and thus the air is precluded from contacting the tantalum as a result of the existence of the printed contact material. It is also thought that the paste in the conductor material (organic binder material) uses up the oxygen present in the air during the firing cycle and thus further starves the tantalum layer of oxygen, preventing oxidation thereof beneath the conductor. At the elevated temperatures and in the absence of oxygen, the tantalum in contact with the silicon surface forms tantalum silicide. Tantalum silicide forms an excellent ohmic contact with the silicon surface. At the same time the metal conductor material, for example, a silver paste, mixes with the tantalum layer and thus provides an excellent ohmic contact with the tantalum. Thus it can be seen that beneath the contact pattern there is provided an excellent ohmic contact through the conductor material, the tantalum metal, the tantalum silicide and directly to the surface of the silicon wafer.

The oxidized tantalum layer forming the anti-reflective coating is shown at 22 in FIG. 2. The contact pattern is illustrated by the slightly raised pattern at 24.

Figure 3:
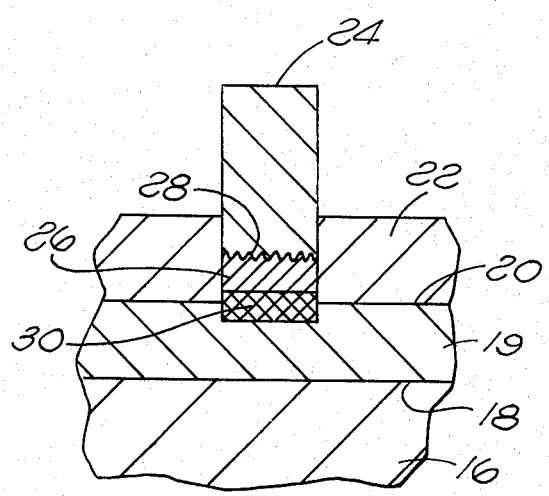
FIG. 3 is an enlarged fragmentary view of a portion of the device as illustrated in FIG. 2.

In order to more clearly illustrate the various portions forming the present invention an enlarged fragmentary view of one of the contact members is illustrated in greater detail in FIG. 3. As is therein shown the body 16 of the wafer 12 with the P/N junction 18 formed by the N-type phosphorous diffused material 19 has provided on the surface 20 the oxidized layer of tantalum 22. The contact pattern 24 has the tantalum layer 26 provided immediately therebeneath. The tantalum layer 26 has, as a result of the firing, been converted to tantalum silicide 30 at the interface with the silicon wafer at a thickness of approximately 50 to 100 Angstroms and thus forms a good ohmic contact to the surface 20. The contact material 24 mixes with the tantalum layer at the interface therewith as is illustrated by the wavy line 28 and forms a good ohmic connection thereto. It should be noted that the antireflective coating 22 is slightly larger in thickness than is the tantalum layer 26. This additional thickness occurs as a result of the oxidation of the tantalum layer during the heating of the tantalum metal in the presence of oxygen. Thus the antireflective coating grows while the tantalum metal beneath the contact 24 does not.

It can thus be seen from the foregoing that upon the application of the tantalum layer and the heating thereof to form the antireflective coating that the surface of the conductive front contact 24 is not covered by any oxidation of any type other than what would normally occur to the particular metal that forms the conductive contact. As a result, the mass production of silicon solar cells is further enhanced in that the completed cell may now be subjected to automated production techniques not heretofore possible.

The exact mechanism present in precluding the conductive material forming the printed contact from punching through the thin silicon N-type layer is not precisely understood. It has not been precisely ascertained as to whether the tantalum layer operates as a complete barrier to the penetration of the material or whether the tantalum metal merely impedes the penetration thereof significantly enough to preclude it from stripping away the silicon dioxide on the silicon surface and then punching through the thin N-type silicon layer 19 to short out the junction. In either event it has been found that by the utilization of the layer of tantalum material there is provided an excellent ohmic contact between the silicon and the contact material without punch-through occurring. At the same time the tantalum layer oxidizes and provides an excellent antireflective coating which in turn does not have to be removed from the front contact layers in order to allow soldering to the contact as is required. Through the utilization of this tantalum layer the junction may now be returned to the more efficient thinner junctions but at the same time mass production techniques may be utilized to form silicon solar cells in larger quantities.

Figure 4:
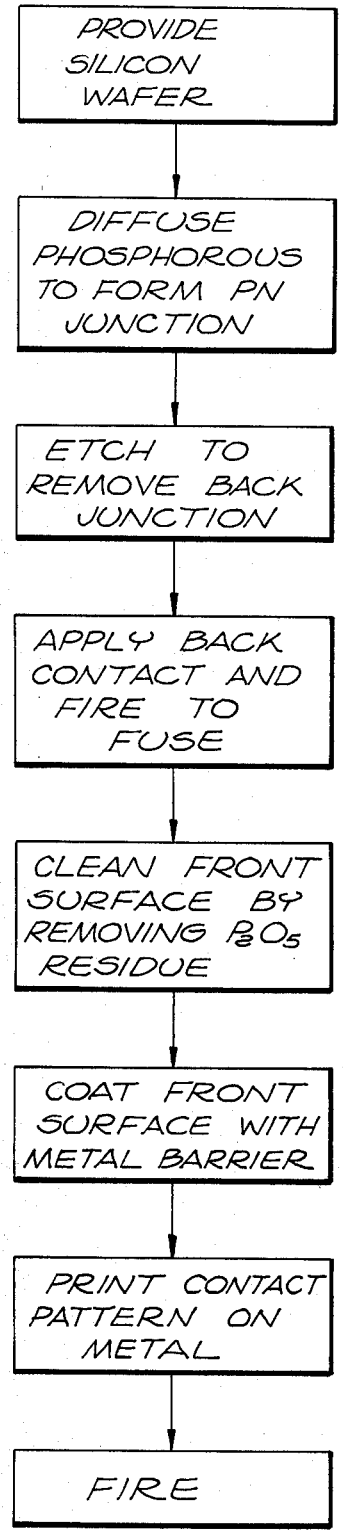
FIG. 4 is a flow chart illustrating the process for forming a silicon solar cell in accordance with the present invention.

By referring now to FIG. 4, the process for manufacturing the cell in accordance with the present invention is shown by way of a flow chart. As has been above-described, an appropriate P-type silicon semiconductor wafer properly etched and cleaned is provided. Thereafter, the wafer is placed within an open tube system at an elevated temperature of about 1200° C. Phosphorous oxychloride is passed thereover thereby to deposit a phosphorous pentoxide glass upon the entire surface of the silicon wafer. The phosphorous contained within the phosphorous pentoxide diffuses into the silicon wafer while at the elevated temperature to thus form the desired P/N junction at the depth of approximately 0.3 microns. Thereafter the back surface of the silicon wafer is etched to remove the phosphorous pentoxide and the P/N junction therefrom. After removal, so that there is a clean silicon surface, an aluminum paste is applied in sufficient quantities over the thusly cleaned surface to provide the desired back contact to the P-type silicon body. The back contact is perfected by heating the aluminum and silicon to an appropriate temperature of about 750° C. to cause a fusing or alloying thereof to occur. Thereafter the front surface wherein the P/N junction is formed is cleaned by again etching the same for example with hydrofluoric acid to remove the residue of phosphorous pentoxide. The cleaned surface is then coated with a 450 angstrom layer of tantalum, tungsten or niobium, as above indicated. Thereafter the desired contact pattern is printed on the surface of the metallic layer, for example, by placing a silver-glass frit material in a desired organic binder thereon in the desired pattern. Subsequent thereto the combination is then heated to a temperature of approximately 600° C. in air thereby to convert the tantalum to tantalum pentoxide and to thus provide an antireflective coating while at the same time providing an excellent ohmic contact between the printed contact pattern and the surface of the solar cell.

It also appears that the back contact may be applied to the cleaned surface of the silicon wafer and subsequently the tantalum layer applied to the cleaned front surface thereof. Subsequently the printed contact is applied to the tantalum layer and the entire combination may then be heated to an elevated temperature sufficient to accomplish alloying of the aluminum into the back surface, the formation of the tantalum oxide antireflective layer and the formation of the front contact all at the same time thereby further enhancing the mass production of solar cells.

It has been found that the metal layer upon the surface of the silicon wafer also functions to protect the shallow junction in the surface of the cell from contaminants normally found in the production equipment, e.g., the furnace or other handling equipment where there is usually a residue of aluminum, silver, phosphorous, boron and other materials. Such protection also renders mass production techniques more feasible than heretofore possible.

What is claimed is:

1. The method of manufacturing a solar cell comprising:
   (A) providing a silicon semiconductor body having a P/N junction at a shallow depth of less than approximately 0.5 microns formed in a first surface thereof;
   (B) applying a layer of metal to said first surface and coextensive therewith;
   (C) printing a pattern of electrically conductive material included in a paste having a glass frit therein on said metal layer;
   (D) heating said body in the presence of oxygen to a temperature of at least approximately 600° C and for a time sufficient to oxidize said metal layer and form an anti-reflective coating on said first surface except where it is covered by said contact material and to form an ohmic contact and bond between said printed electrically conductive material and said first surface without destroying said P/N junction; and
   (E) cooling said body.

2. The method as defined in claim 1 wherein said metal layer has a thickness of approximately 450 Angstroms.

3. The method as defined in claim 2 wherein said metal layer is selected from the group consisting of tantalum and niobium.

4. The method of claim 3 which further includes the step of applying a layer of conductive material to a second surface of said body, said layer being capable of alloying with said silicon body and having the same conductivity type as said body at said second surface, and then heating said body to a temperature sufficient to alloy said conductive material to said second surface simultaneously with the formation of said oxide.

5. The method as defined in claim 1 wherein said metal is tantalum and said bond to said first surface is tantalum silicide.

6. The method of manufacturing a solar cell comprising:
   (A) providing a P-type silicon semiconductor body having a layer of N-type material and a P/N junction at a shallow depth of less than approximately 0.5 microns formed in a first surface thereof and an ohmic contact on the opposite surface of said body;
   (B) applying a layer of metal having a thickness approximately 450 Angstroms and selected from the group consisting of tantalum and niobium to said first surface and coextensive therewith;
   (C) printing a pattern of electrically conductive material included in a paste having a glass frit therein on said metal layer;
   (D) heating said body in the presence of oxygen to a temperature of at least 600° C and for a time sufficient to oxidize said metal layer and form an anti-reflective coating on said first surface except where it is covered by said contact material and to form a layer of the silicide of said metal at the interface with said first surface to provide an ohmic contact and bond between said printed electrically conductive material and said first surface without destroying said P/N junction; and
   (E) cooling said body.

7. A silicon solar cell made by the method of:
   (A) providing a P-type silicon semiconductor body having a P/N junction at a shallow depth of less than approximately 0.5 microns formed in a first surface thereof and an ohmic contact on the opposite surface of said body;
   (B) applying a layer of metal having a thickness approximately 450 Angstroms and selected from the group consist of tantalum and niobium to said first surface and coextensive therewith;
   (C) printing a pattern of electrically conductive material including a paste having a glass frit therein on said metal layer;
   (D) heating said body in the presence of oxygen to a temperature of at least 600° C and for a time sufficient to oxidize said metal layer and form an anti-reflective coating on said first surface except where it is covered by said contact material and to form a layer of the silicide of said metal at the interface with said first surface to provide an ohmic contact and bond between said printed electrically conductive material and said first surface without destroying said P/N junction; and
   (E) cooling said body.

* * * * *